United States Patent [19]

Reisman et al.

[11] Patent Number: 5,039,625
[45] Date of Patent: Aug. 13, 1991

[54] MAXIMUM AREAL DENSITY RECESSED OXIDE ISOLATION (MADROX) PROCESS

[75] Inventors: Arnold Reisman, Raleigh; Mark Kellam, Chapel Hill; Charles K. Williams, Raleigh; Nandini Tandon, Durham, all of N.C.

[73] Assignee: MCNC, Research Triangle Park, N.C.

[21] Appl. No.: 516,246

[22] Filed: Apr. 27, 1990

[51] Int. Cl.$^5$ .................................................. H01L 21/76
[52] U.S. Cl. ............................ 437/69; 148/DIG. 86; 148/DIG. 117; 437/56; 437/233; 437/235; 437/238; 437/968
[58] Field of Search .................. 437/56, 235, 233, 913, 437/968, 238, 69; 148/FIG. 86, DIG. 117

[56] References Cited

U.S. PATENT DOCUMENTS

| | | |
|---|---|---|
| 3,900,350 | 8/1975 | Appels et al. |
| 3,961,999 | 6/1976 | Antipov |
| 4,232,057 | 11/1980 | Ray et al. |
| 4,323,589 | 4/1982 | Ray et al. |
| 4,506,437 | 3/1985 | Godejahn, Jr. ................ 437/56 |
| 4,510,172 | 4/1985 | Ray ................................ 437/235 |
| 4,541,167 | 9/1985 | Havemann et al. |
| 4,552,595 | 11/1985 | Hoga |
| 4,572,841 | 2/1986 | Kaganowicz ................. 427/39 |
| 4,630,356 | 12/1986 | Christie et al. |
| 4,662,312 | 5/1987 | Aoki |
| 4,686,762 | 8/1987 | Chai et al. |
| 4,691,222 | 9/1987 | Cox |
| 4,700,461 | 10/1987 | Choi et al. ................... 437/238 |
| 4,727,038 | 2/1988 | Watabe et al. ................ 437/56 |
| 4,746,625 | 5/1988 | Morita et al. |
| 4,748,134 | 5/1988 | Holland et al. |
| 4,755,477 | 7/1988 | Chao |
| 4,758,530 | 7/1988 | Schubert ...................... 437/69 |
| 4,775,644 | 10/1988 | Szeto |
| 4,776,922 | 10/1988 | Bhattacharyna et al. ..... 437/235 |
| 4,818,235 | 4/1989 | Chao |
| 4,855,258 | 8/1989 | Allman et al. |
| 4,866,004 | 9/1989 | Fukushima |
| 4,871,630 | 10/1989 | Giammarco et al. |
| 4,900,689 | 2/1990 | Bajor et al. ................... 437/31 |
| 4,935,095 | 6/1990 | Lehrer .......................... 437/235 |
| 4,947,085 | 8/1990 | Nakanishi ..................... 118/50.1 |

FOREIGN PATENT DOCUMENTS 0209831 9/1987 Japan .................................. 437/238
0264265 10/1989 Japan .................................. 437/913

OTHER PUBLICATIONS

"Plasma Assisted Oxidation of Si at Temperatures Below 800° C.,", Williams et al., Mat. Res. Soc. Sym. Proc., vol. 68, Materials Research Society, pp. 79-84.
"Plasma Oxide FET Devices", Ray et al., J. Elec. Soc., vol. 128, No. 11, Nov. 1981, pp. 2424-2428.
"The Formation, ... ", Ray et al., J. Elec. Soc., vol. 128, No. 11, Nov. 1981, pp. 2466-2472.
Nitridation of Silicon in a Multiwafer Plasma System, A. Reisman, M. Berkenblit, A. K. Ray, C. J. Merz, Journal of Electronic Materials, vol. 13, No. 3, May 1984, pp. 505-521.
The Formation of $SiO_2$ in an RF Generated Oxygen Plasma, II. The Pressure Range Above 10mTorr, A. K. Ray and A. Reisman, Journal of the Electrochemical Society, vol. 128, No. 11, Nov. 1981, pp. 2466-2472.

*Primary Examiner*—Olik Chaudhuri
*Assistant Examiner*—Kenneth E. Horton
*Attorney, Agent, or Firm*—Bell, Seltzer, Park & Gibson

[57] ABSTRACT

A Maximum Areal Density Recessed Oxide Isolation (MADROX) process for forming semiconductor devices, in which forms an insulating layer is formed on a monocrystalline silicon substrate and a patterned polycrystalline silicon-containing layer is formed on the insulating layer. The substrate is then subjected to a low temperature plasma assisted oxidation to form recessed oxide isolation areas in the exposed regions of the substrate, with minimal encroachment under the patterned polycrystalline silicon-containing layer. The patterned polycrystalline silicon-containing layer acts as a mask, without itself being oxidized. Low temperature recessed oxide isolation regions may thereby be formed, without "bird's beak" formation. Maximum Areal Density Bipolar and Field Effect Transistor (MADFET) devices may be formed, using the patterned polycrystalline silicon-containing layer as a device contact if desired.

33 Claims, 6 Drawing Sheets

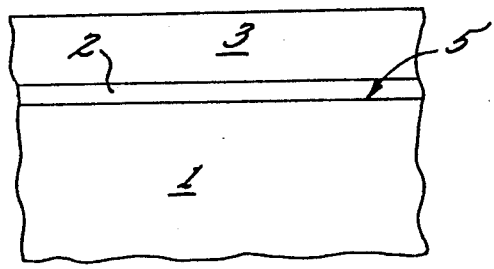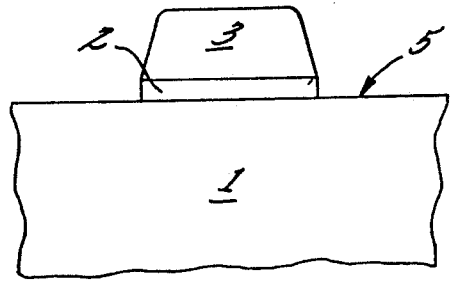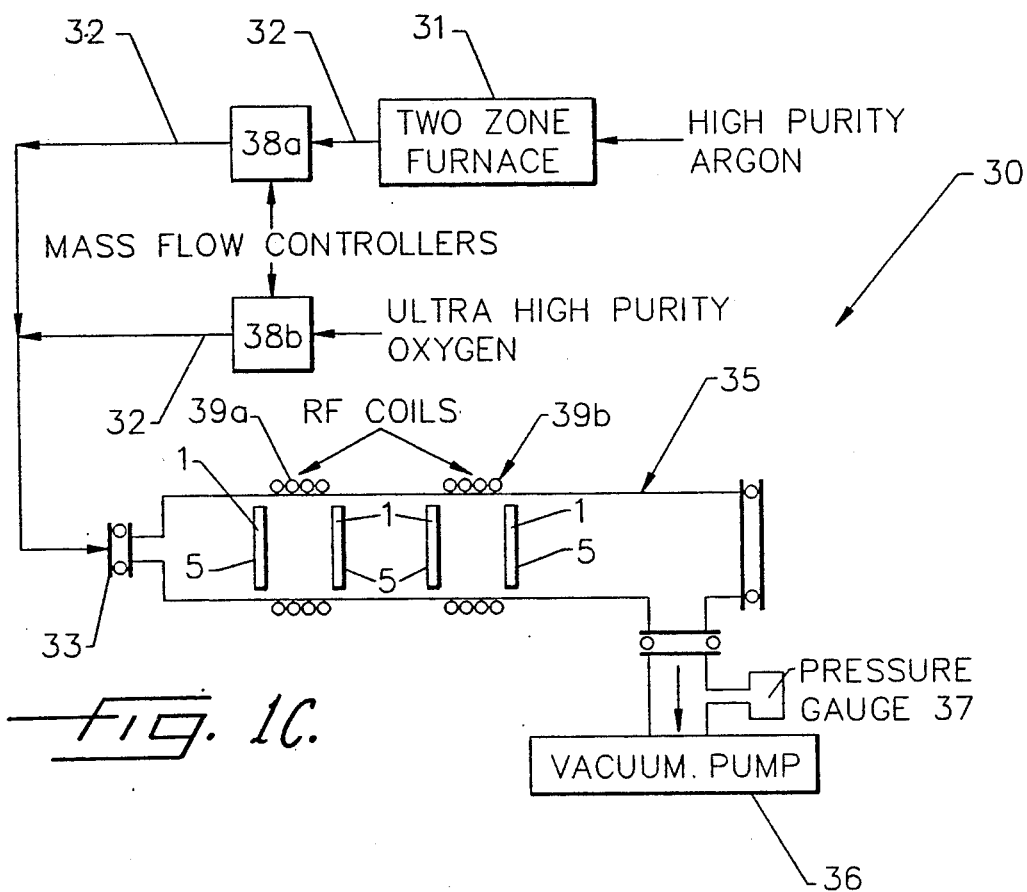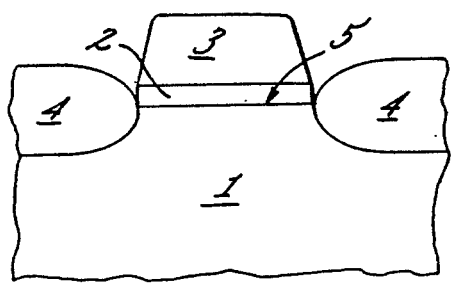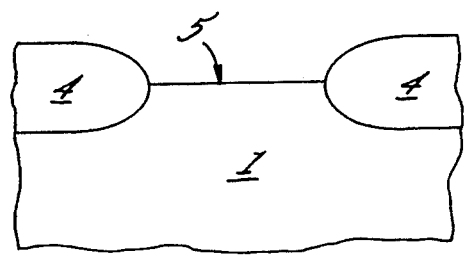

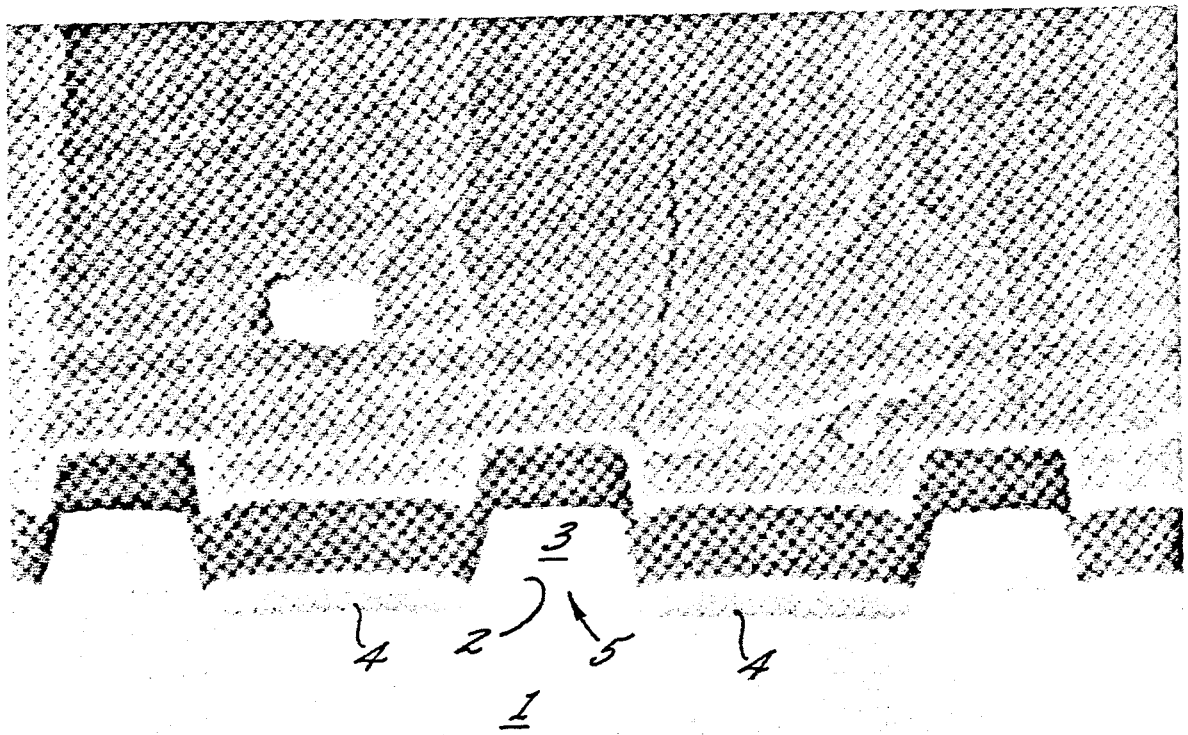
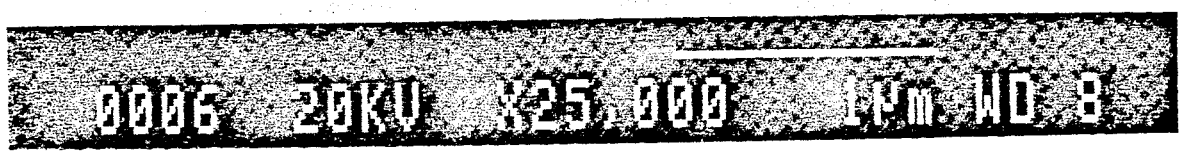
Fig. 5.

MAXIMUM AREAL DENSITY RECESSED OXIDE ISOLATION (MADROX) PROCESS

FIELD OF THE INVENTION

This invention relates to semiconductor fabrication processes and more particularly to a recessed oxide isolation process which allows devices having maximal areal density to be formed in a semiconductor substrate using a minimum number of process steps.

BACKGROUND OF THE INVENTION

In fabricating very large scale integration (VLSI) and ultra large scale integration (ULSI) circuits it is increasingly important to provide maximum areal density for the devices from which the circuits are formed. As is well known to those having skill in the art, in a VLSI or ULSI regime, millions of active devices may be formed on a single integrated circuit chip. These active devices must be electrically isolated from one another. In providing isolation regions between devices, it is important that the area devoted to isolation regions be minimized so that the device area is maximized.

Recessed oxide (ROX) isolation techniques are widely used for device isolation in silicon semiconductor substrates. In a recessed oxide isolation process, a silicon nitride or silicon nitride-silicon dioxide composite structure, or other mask is used to pattern the surface of the silicon semiconductor substrate and thereby define exposed regions thereon. The silicon substrate is then thermally oxidized at high temperatures of about 1000° C., in order to convert the exposed regions to silicon dioxide, which form the recessed oxide isolation regions.

Unfortunately, it has been found that when recessed oxide is formed by thermally oxidizing exposed portions of a silicon substrate, the oxidation occurs laterally as well as vertically. This lateral encroachment of the oxide reduces the area available for device fabrication. Since the cross section of the laterally encroaching oxide looks like a bird's beak, the lateral encroachment phenomena has been referred to as the "bird's beak" phenomena.

As the device density of integrated circuits has increased, bird's beak has become more of a problem. For example, if a device is 40 $\mu$m wide and the bird's beak encroaches by 2 82 m, only a slight reduction in the device area to 36 $\mu$m is produced. However, if a VLSI or ULSI device is less than 4 $\mu$m wide, the bird's beak encroachment can completely eliminate the device area. Accordingly, the art has concentrated on techniques for minimizing bird's beak.

Many bird's beak reduction techniques use a silicon nitride mask layer on the silicon semiconductor substrate, to prevent thermal oxidation of the semiconductor substrate lying thereunder. See for example U.S. Pat. Nos. 4,662,312 to Aoki, 4,775,644 to Szeto, 4,818,235 to Chao, 4,855,258 to Allman et al. and 4,686,762 to Chai et al. However, it has been found that the silicon nitride mask does not completely eliminate the bird's beak. Moreover, silicon nitride produces compatibility problems with silicon substrates. The silicon nitride mask must also be removed before devices may be formed in the substrate.

Other techniques for preventing bird's beak use polycrystalline silicon masks. Polycrystalline silicon, often referred to as "polysilicon" or simply "poly", is a well characterized material and is highly compatible with standard silicon processing steps. As such, polycrystalline silicon is widely used in semiconductor device fabrication, for example for device contacts. However, it is well known that polycrystalline silicon alone cannot be employed as a mask against thermal oxidation in the recessed oxide isolation process, because polycrystalline silicon oxidizes like monocrystalline silicon during thermal oxidation. Accordingly, if polycrystalline silicon is used it must be encapsulated to prevent oxidation. See, for example, U.S. Pat. Nos. 4,746,625 to Morita et al. and 4,541,167 to Havemann et al. ROI processes using polycrystalline silicon are typically complex, requiring many extra fabrication steps, and do not wholly eliminate the bird's beak.

Thermal oxidation also creates other problems in semiconductor device fabrication because it is a high temperature process. Diffusion of impurities is enhanced at high temperatures making it difficult to form pure devices with controlled impurity levels. Moreover, high temperature processing also produces device variability and reduces process uniformity. For example, in fabricating field effect transistor devices, nonuniform threshold voltage sensitivity as a function of substrate voltage is obtained as a result of high temperature processing.

An attempt to eliminate bird's beak using low temperature processing steps is described in publications entitled "*Plasma Oxide FET Devices*" and "*The Formation of $SiO_2$ in an RF Generated Oxygen Plasma*", published in Volume 128, Number 11 of the Journal of the Electrochemical Society, November 1981, pages 2424–2428 and 2466–2472, respectively, by A. K. Ray and A. Reisman. In these publications, a low temperature plasma oxidation process is described wherein a radio frequency (RF) generated oxygen plasma is produced at pressures above 10 mtorr and at nominal temperatures of about 500° C. It was shown that high quality oxides can be grown at low temperatures without bird's beak. U.S. Pat. Nos. 4,323,589 and 4,232,057 to A. K. Ray and A. Reisman also describe this plasma assisted oxidation process.

The plasma assisted oxidation described in the above mentioned publications and patents uses a magnesium oxide (MgO) oxidation mask. Magnesium oxide is not commonly used in semiconductor fabrication processes because it is not readily available in semiconductor grade quality. Moreover, since magnesium oxide is not a conductor it cannot also be used as an electrode or contact. It must be removed after the plasma assisted oxidation. Unfortunately, magnesium oxide is difficult to remove using common etching processes.

It would be highly desirable to use more common materials as a mask in a low temperature plasma assisted oxidation, so that existing equipment and well known materials can be used. In fact, it would be most desirable to use polycrystalline silicon for such a mask because polycrystalline silicon is widely used in silicon semiconductor technology. Moreover, polycrystalline silicon may be appropriately doped to produce electrical contacts. However, if polysilicon is used as a mask in the above described plasma assisted oxidation process it will oxidize along with the monocrystalline silicon substrate that it is masking.

SUMMARY OF THE INVENTION

It is therefore an object of the invention to provide an improved recess oxide isolation (ROX) fabrication process.

It is another object of the invention to provide a recessed oxide isolation process which produces maximum areal density of active devices.

It is yet another object of the invention to provide a low temperature Maximal Area Density Recessed Oxide (MADROX) isolation process.

It is still another object of the invention to provide a low temperature MADROX process which uses common processing materials for silicon based technology.

These and other objects are provided according to the present invention by a MADROX process in which a monocrystalline silicon substrate having an insulating layer thereon and a patterned polycrystalline silicon-containing layer on the insulating layer, is oxidized using a plasma oxidation to form recessed oxide isolation regions in the exposed regions of the substrate which are not covered by the polycrystalline silicon-containing layer, with minimal encroachment under the patterned polycrystalline silicon-containing layer. Unexpectedly, it has been found that when an insulating layer is formed between the substrate and the patterned polycrystalline silicon-containing mask layer, the polycrystalline silicon-containing layer acts as a mask in the plasma oxidation process without itself being substantially oxidized. In other words, even though the exposed regions of the silicon substrate are oxidized, the exposed polycrystalline silicon-containing layer is not oxidized. Accordingly, low temperature oxidation of the substrate may be performed. The low temperature plasma oxidation produces anisotropic (directional) oxidation of the substrate, to produce recessed oxide isolation regions with minimal encroachment under the patterned polycrystalline silicon-containing mask layer. Magnesium oxide or other esoteric materials need not be used as a mask.

More particularly, according to the present invention, a thin silicon dioxide insulating layer is formed on the semiconductor substrate and a polycrystalline silicon-containing layer is formed thereon. The polycrystalline silicon-containing layer may be, for example, undoped polycrystalline silicon, doped polycrystalline silicon or a combination of polycrystalline silicon with other materials, such as polycide (polysilicon silicon having a refractory metal silicide layer thereon). The polycrystalline silicon-containing layer is then patterned to expose the recessed oxide isolation regions and mask the device regions. At this stage the polycrystalline silicon patterns may have oxide spacers grown or deposited upon them using well known techniques. The substrate is then oxidized using the low temperature plasma assisted oxide process described in the Ray and Reisman publications and patents. Unexpectedly, it has been found that there is no lateral encroachment of the field oxide under the poly mask and there is minimal if any oxidation of the poly mask itself.

It is believed that the thin oxide layer serves to insulate the polycrystalline silicon mask layer from the underlying silicon substrate. Accordingly, when growing oxide using the field assisted plasma technique, the polycrystalline silicon-containing mask electrically "floats" in the plasma, relative to the silicon substrate. Since the polycrystalline silicon-containing mask is at a low floating potential it does not attract the oxide species which are attracted to the silicon substrate. Accordingly, the polycrystalline silicon-containing mask is not converted to oxide even though the unmasked areas of the silicon substrate are converted to oxide. Since the insulating layer must electrically insulate the poly mask from the substrate, it must be void free. Accordingly, when the insulating layer is silicon dioxide, it must be thick enough to ensure a void-free layer. For example a silicon dioxide layer 7 nm-200 nm thick may be used, although thinner layers may also be used.

After recessed oxide isolation formation, the polycrystalline silicon-containing mask layer after a second patterning process, may be used as a mask layer for device region implants and may also be used subsequently as the gate contact in a polysilicon gate process for forming Maximum Areal Density metal insulator semiconductor Field Effect Transistors (MADFETs). The thin insulating layer may be used as the gate insulation in such devices. Alternatively, to form Insulated Gate FETs (IGFETs) or bipolar devices, the polycrystalline silicon mask composite may be removed after the recessed oxide isolation regions are formed, and the IGFET bipolar devices may be formed in the areas uncovered by removal of the mask. The polycrystalline layer, after a second patterning process, may have oxide spacers formed thereon, to form so called Lightly Doped Drain (LDD) or Medium Doped Drain (MMD) structures which are well known to those skilled in the art. In addition, a second poly layer may be used to contact the initial poly layer. The second layer may be used to partially overlay regions of the isolation oxide that have been grown. If desired, it can be deposited and patterned prior to device implantation process steps.

BRIEF DESCRIPTION OF THE DRAWINGS

FIG. 1A illustrates a cross sectional view of a semiconductor substrate having an insulating layer and a patterned polycrystalline silicon-containing layer thereon, according to the present invention.

FIG. 1B illustrates the substrate of FIG. 1A, after patterning the insulating layer and polycrystalline silicon-containing layer, according to the present invention.

FIG. 1C illustrates a plasma assisted oxidation process being performed on the substrate of FIG. 1B, according to the present invention.

FIG. 1D illustrates the substrate of FIG. 1B after the plasma assisted oxidation of FIG. 1C, according to the present invention.

FIG. 1E illustrates the substrate of FIG. 1D after removal of the patterned insulating and polycrystalline silicon-containing layers, according to the present invention.

FIG. 5 is a microphotograph of the substrate of FIG. 1D, according to the present invention.

DETAILED DESCRIPTION OF THE PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout. For purposes of clarity, the thickness of layers has been exaggerated.

Referring now to FIGS. 1A-1E, formation of maximum areal density recessed oxide isolation (MADROX) regions according to the present invention will now be described. As shown in FIG. 1A, an insulating layer 2 is formed on face 5 of a monocrystalline silicon substrate 1. Insulating layer 2 is preferably silicon dioxide (SiO$_2$) which may be formed using conventional thermal oxidation at high temperatures (800° C.–1,000° C.). The SiO$_2$ may be formed at any desired thickness. For example 70–200Å of SiO$_2$ may be formed when the SiO$_2$ layer 2 will form the gate oxide of a Metal Oxide Semiconductor Field Effect Transistor (MOSFET) device, as described below in connection with FIGS. 2A-2C. According to the invention, the thickness of insulating layer 2 is not critical provided that it is thick enough to form a void free layer. Accordingly, for typical thermally deposited SiO$_2$, layers, a thickness of at least 7 nm may be desired. Other insulating layers which can withstand low temperature plasma oxidation may also be used, taking into account the maximum process temperatures to which the insulator will be subjected and the differential stress created by the insulator.

Figure 2A:
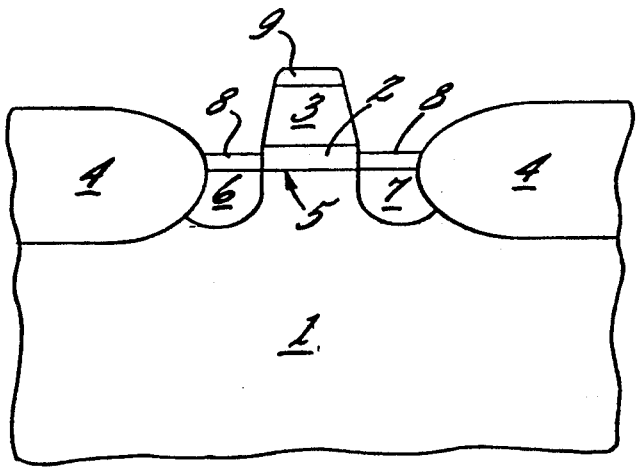
FIG. 2A illustrates the substrate of FIG. 1D after repatterning and source/drain formation, according to the present invention.
Figure 2B:
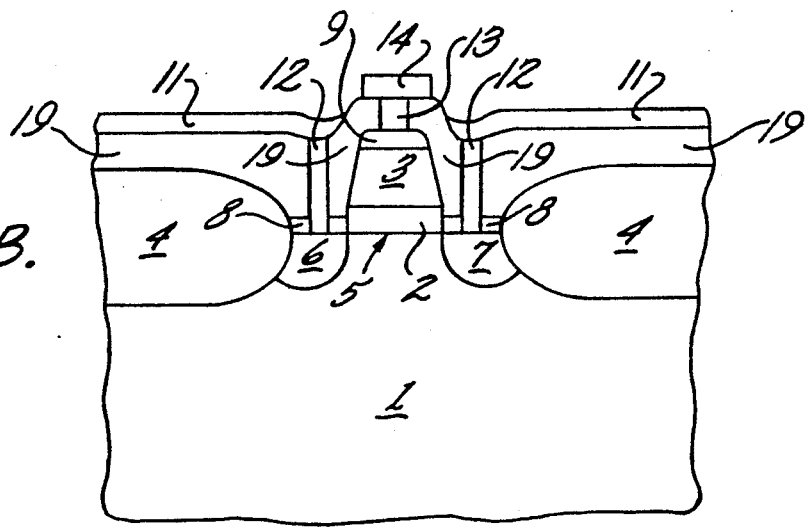
FIG. 2B illustrates the substrate of FIG. 2A after source and drain electrode formation, according to the present invention.
Figure 2C:
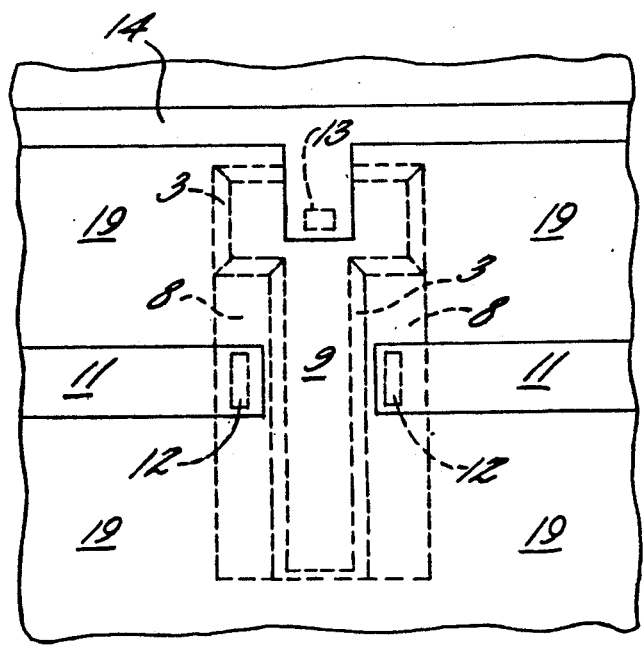
FIG. 2C illustrates a top view of the substrate of FIG. 2B after gate electrode formation, according to the present invention.

Still referring to FIG. 1A, a polycrystalline silicon-containing layer ("poly layer") 3 is formed on the insulating layer 2. Poly layer 3 may be deposited at any desired thickness, consistent with subsequent processing requirements. When the polysilicon layer 3 will be used to form a gate contact of a MOSFET device as shown in FIGS. 2A-2C, a thickness of 2500Å to 3000Å is typically used.

Referring now to FIG. 1B, the poly layer 3 is patterned using, for example, conventional photolithography techniques. Alternatively, poly layer 3 may be initially deposited as a patterned layer using for example selective area deposition techniques. It will be understood by those having skill in the art that insulating layer 2 may also be patterned along with the poly layer 3 as shown in FIG. 1B. Alternatively, insulating layer 2 may be left unpatterned.

It will also be understood by those having skill in the art that the width of patterned polysilicon layer 3 is made equal to the desired width for the device region within silicon substrate 1. Because the present invention eliminates bird's beak, allowance need not be made for recessed oxide isolation encroachment under polysilicon layer 3. Accordingly, for submicron device technology the width of polycrystalline silicon layer 3 may be less than 1 μm.

A field assisted plasma oxidation is performed on the silicon wafer 1 according to the process described in U.S. Pat. Nos. 4,323,589 and 4,232,057 to A. K. Ray and A. Reisman, the disclosures of which are hereby incorporated herein by reference. This process is also described in the aforementioned publications in the Journal of the Electrochemical Society, November, 1981 pages 2424–2428 and 2466–2472 by A. K. Ray and A. Reisman, the disclosures of which are hereby incorporated herein by reference. In the low temperature plasma assisted oxide process described in the Ray and Reisman patents and publications, an oxygen plasma is generated at pressures above 10 mtorr in an electrodeless fused silica reaction chamber using for example, a 3 mHz radio frequency generator having a 1 kilowatt power output. Frequencies from the kiloHertz to the 20 mHz range or greater may be used. Temperatures between 300°–700° C. are used, with nominal temperature being around 500° C. The system is pumped continuously during oxidation and the oxygen pressure is varied by varying the oxygen flow rate.

A preferred embodiment of a plasma assisted oxidation system is described in *"Plasma Assisted Oxidation of Si at Temperatures Below 800° C."*, published in the Materials Research Society Symposium Proceedings, Volume 68, pages 79–84, 1986, to C. K. Williams and A. Reisman, the disclosure of which is hereby incorporated herein by reference. An alternative embodiment for use in plasma assisted nitridation is described in *"Nitridation of Silicon in a Multiwafer Plasma System"*, published in the Journal of Electronic Materials, Vol. 13, No. 3, pages 505–521, May 1984, by A. Reisman et al., the disclosure of which is hereby incorporated herein by reference.

Referring now to FIG. 1C, a preferred embodiment of the plasma assisted oxidation system 30 is shown. High purity argon is obtained by taking the boil-off from a liquid argon source. The argon is further purified by passing it over a titanium bed in a two zone furnace 31. The first zone of the furnace is heated to 700° C. to strip the oxygen from any residual water vapor by oxidizing the titanium. The hydrogen released is then absorbed by the titanium in the second zone which is heated to 500° C. Ultra pure oxygen is obtained by using bottled oxygen with a purity of 99.993%. All gas lines 32 are constructed of high purity ½″ stainless steel tubing and all connections (except those to the reactor) are made with welded fittings. Connections to the reactor tube 35 are made with O-ring joints 33 to facilitate removal and cleaning. The reactor tube 35 is 40″ long and is made from 110×115 mm fused silica. A 90×95 mm fused silica liner tube (not shown) may be placed inside the reactor tube 35 to reduce the wafer-to-wall distance to approximately 7 mm for 3" wafers. A turbomolecular vacuum pump 36 is used to pump the system continuously. The pressure is measured using a capacitance manometer or other pressure gauge 37. The latter may also be used to control an automatic throttle valve to maintain a constant pressure independent of the gas flow rates. The gas flows are controlled by mass flow controllers 38a and 38b.

RF coupling to the system is effected by two four turn coils 39a, 39b of ¼" outside diameter copper tubing placed around the reactor tube 35, and separated from each other by 6". Wafers 1 are held perpendicular to the direction of gas flow by a slotted four rail quartz boat (not shown) with face $ facing away from coils 39. Pairs of wafers 1 were positioned on either side of each four turn coil 39 so that the plasma generated was confined between each wafer pair. The range of pressures used was such that the $SiO_2$ formed primarily on the dark side (the side facing away from the plasma) of the wafers. The plasma was initiated in pure argon. Two different rf sources may be used. An rf induction heater with an output capacity of 20 kW may be used to provide an 0.5 MHz source, and a combination of an oscillator, amplifier, and a matching network with an output capacity of 1 kW may be used for frequencies of 3 MHz and above. As stated above, a wide range of other frequencies may be used.

As described in the aforesaid patents and publications, plasma oxidation may be used to anisotropically (directionally) form oxides with properties substantially similar to oxides which are grown thermally. However, the temperature to which a substrate must be subjected is much less than that used for thermally grown oxide. For example, plasma oxidation may take place at around 500° C. or less while thermal oxide formation generally takes place above 800° C.

The thickness of the oxide formed in the plasma oxidation step is a function of the pressure, time, temperature, and radio frequency power and frequency. Accordingly, these parameters may be adjusted to provide the desired thickness of recessed oxide isolation regions. It will also be understood that the frequency used to create the plasma excitation may range from below the kiloHertz range to the gigaHertz range and beyond.

Referring now to FIG. 1D, upon removal from the plasma oxidation chamber, recessed oxide isolation regions 4 have been formed. Recessed oxide isolation regions may be, for example, 2000-3000Å thick. As illustrated in FIG. 1D, the recessed oxide isolation regions do not encroach under poly layer 3, thus eliminating the "bird's beak", and allowing the entire width of the semiconductor substrate under the poly layer 3 to be used for device formation. Moreover, unexpectedly, the poly layer 3 has not been oxidized to any measurable extent. It is believed that no oxidation occurs because insulating layer 2 insulates the poly layer 3 from the substrate 1 thereby allowing the poly layer 3 to electrically float and preventing attraction of oxide species thereto.

The structure of FIG. 1D may be used to fabricate bipolar transistors, field effect transistors or other devices in silicon substrate 1 between the recessed oxide isolation regions 4. In order to form bipolar devices and many other devices, poly layer 3 is removed. Insulating layer 2 may also be removed so that the face 5 of silicon substrate 1 is exposed for active device formation, as shown in FIG. 1E. Alternatively, as shown in FIGS. 2A-2C, 3A-3C and 4A-4D, insulating region 2 may form the gate oxide of a MOSFET, and at least part of poly layer 3 of FIG. 1B may form the gate contact of the MOSFET.

Referring now to FIGS. 2A-2C, the operations to form a MOSFET using the substrate of FIG. 1D will now be described. As shown in FIG. 2A, poly layer 3 and insulating layer z may be further patterned to narrow these regions, expose second regions of the semiconductor substrate, and allow formation of the source 6 and the drain 7 of the MOSFET through the exposed second regions. As is well known to those having skill in the art, the source and drain regions may be implanted or otherwise formed through a thin oxide or other insulating layer 8 which may or may not be formed from the insulating layer 2. As also shown in FIG. 2A, a layer of a refractory metal or refractory metal silicide 9 may be formed on poly layer 3, prior to or after plasma assisted oxidation. As is well known by those having skill in the art, a multilayer structure consisting of a low resistance material such as a refractory metal silicide on top of a doped poly layer is referred to as a polycide. The refractory metal silicide may be formed using a self-aligned silicide ("salicide"), process which is well known to those having skill in the art. In the salicide process, a refractory metal layer is reacted with the underlying poly layer to form refractory metal silicide. Also prior to source drain implantation, oxide spacers may be formed on the sidewalls of the poly gate electrode, using processing techniques well known in the industry.

Referring now to FIG. 2B, a conformal layer of chemical vapor deposited (CVD) silicon dioxide ($SiO_2$) 19 may be deposited over the substrate. Metal lines 11 may be formed on the CVD $SiO_2$ layer 19 over recessed oxide 4 (also referred to as the "field oxide") and contacts 12 to the source and drain regions 6 and 7 may be formed through the CVD $SiO_2$ using techniques well known to those having skill in the art. It will be understood by those having skill in the art that metal lines 11 and contacts 12 may be made of the same or technologically compatible different metals. A metal line 14 may be formed on CVD $SiO_2$ layer 11 over the poly gate region 3. A gate contact 13 may be provided through the CVD $SiO_2$ layer 11 to poly layer 3 (or to salicide or metal layer 9). See FIG. 2C. Alternatively, a second poly layer may be formed to bridge line 14 and first poly layer 3 using processes well known to those having skill in the art. The complete device shown in FIGS. 2B-2C has a maximum areal density with minimum area devoted to recessed oxide isolation regions 4. Chip real estate savings of 20% or more may be realized.

Figure 3A:
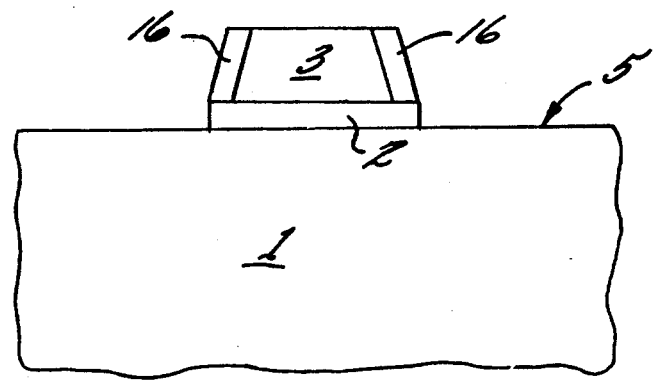
FIG. 3A illustrates a cross sectional view of a patterned polycrystalline silicon layer having spacers thereon, according to the present invention.
Figure 3B:
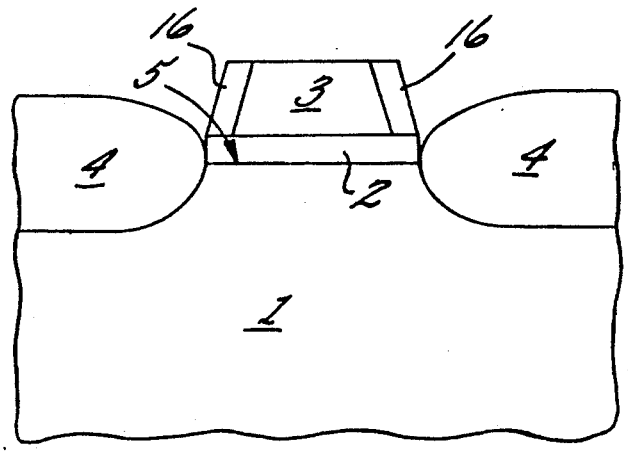
FIG. 3B illustrates the substrate of FIG. 3A after the plasma assisted oxidation of FIG. 1C, according to the present invention.
Figure 3C:
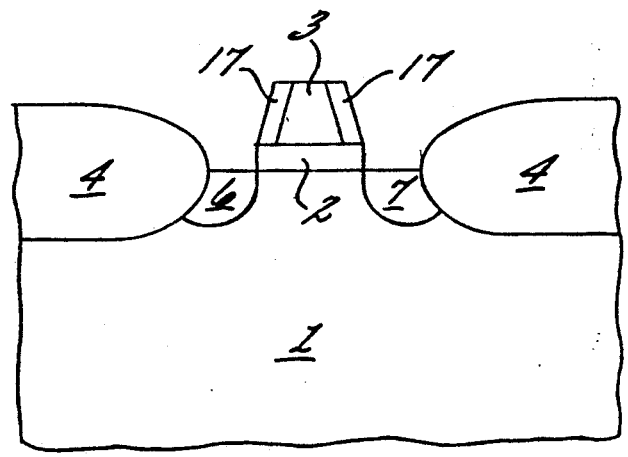
FIG. 3C illustrates the substrate of FIG. 3B after repatterning, reformation of spacers and source and drain formation, according to the present invention.

Referring now to FIG. 3A-3C, the use of "spacer" technology in combination with the MADROX process of the present invention to form a MOSFET will now be described. The structure of FIG. 1B is first formed. Then, a pair of insulating spacers 16, for example silicon dioxide spacers, 0.02-0.05 μm thick, for example, are formed on the sidewall of poly layer 3 using techniques well known to those having skill in the art. Silicon nitride or multiple layer spacers may also be used. The structure is then placed in the plasma oxidation chamber shown in FIG. 1C to grow recessed oxide isolation regions 4 as shown in FIG. 3B. As shown in FIG. 3C, the spacers 16 are removed and, if necessary, the poly layer 3 is further patterned. Source 6 and drain 7 are then formed. New spacers 17 may then be formed if desired. Contact formation may then continue as was previously described in connection with FIGS. 2B-2C, to form the MOSFET. It will be understood by those having skill in the art that spacer technology may also be used in the poly regions 3 of FIGS. 1B and 2A respectively.

Figure 4A:
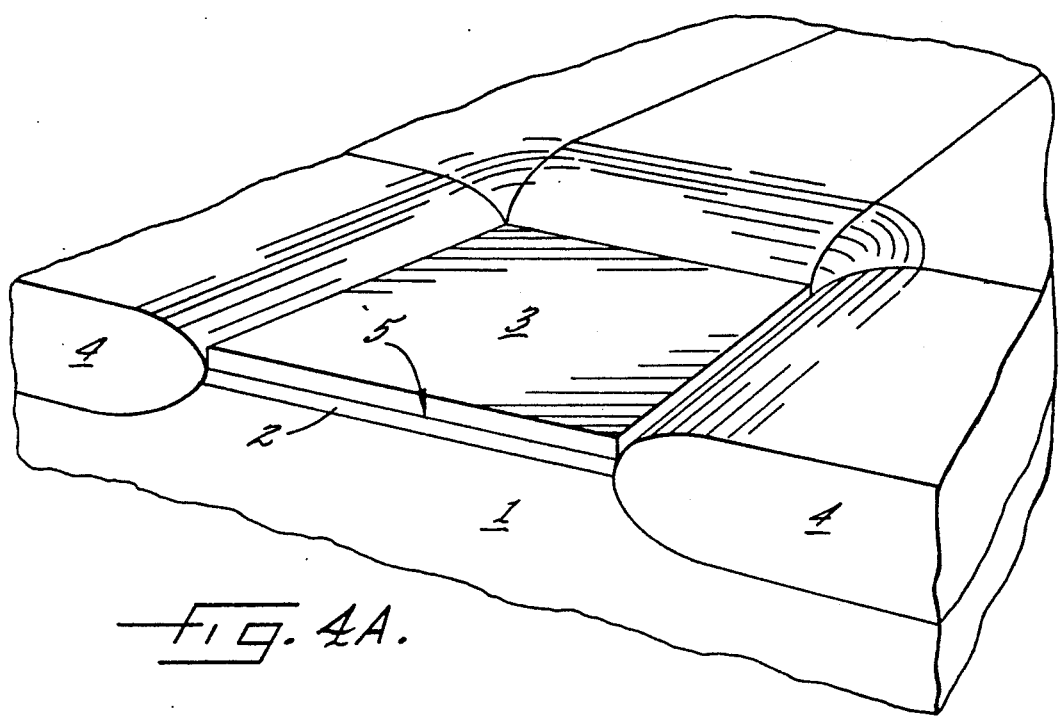
FIG. 4A illustrates a cross sectional perspective view of the substrate of FIG. 1D, according to the present invention.
Figure 4B:
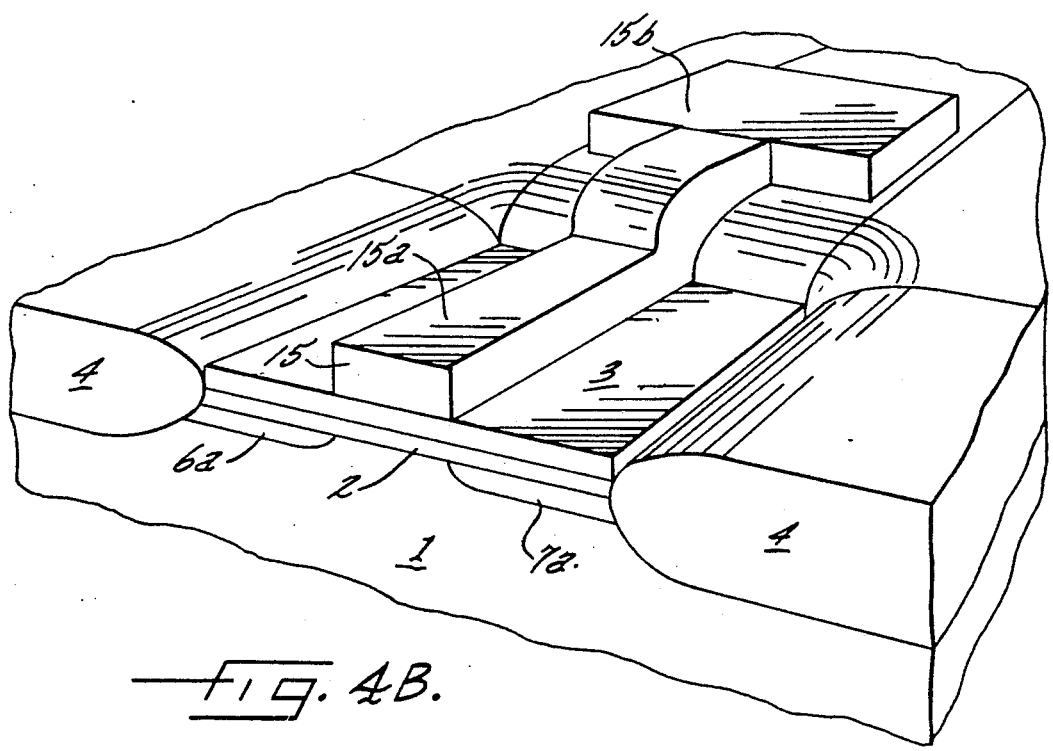
FIG. 4B illustrates the substrate of FIG. 4A after forming a second polycrystalline contact layer and lightly doped source and drain regions, according to the present invention.

Referring now to FIGS. 4A-4D, a double poly process for forming a MOSFET according to the present invention will now be described. One of many possible implementations is referred to as an "Inverse-T Lightly Doped Drain" (ITLDD) transistor. It will be understood that the second poly layer can be used simply as a means of extending the initial poly so that it overlies the field oxide regions. Referring to FIG. 4A, a perspective view of the structure of FIG. 1D is shown. In FIG. 4A, the poly layer 3 is typically a thinner layer than shown in FIGS. 1A-1E, 2A-2C and 3A-3C, for example about 50 nm thick, because a lightly doped drain implant will be performed through poly layer 3. As shown in FIG. 4B, a second poly layer 15 is formed on first poly layer 3 using, for example, low pressure chemical vapor deposition, to a thickness of, for example, 200 nm. This blanket deposited second poly layer 15 is then patterned using an etchant such as gaseous bromine in a Reactive Ion Etching (RIE) system which etches second poly layer 15 with very high selectivity to the oxide layers which are present in the structure. Second poly layer 15 is then patterned to form a narrow portion 15A above the first poly layer 3 and a contact pad 15B on the recessed oxide 4, in the so called "inverse T" configuration. After patterning second poly layer 15, lightly doped source and drain implantations may be formed as shown at 6a and 7a, through the first poly layer 3 and gate oxide 2.

Figure 4C:
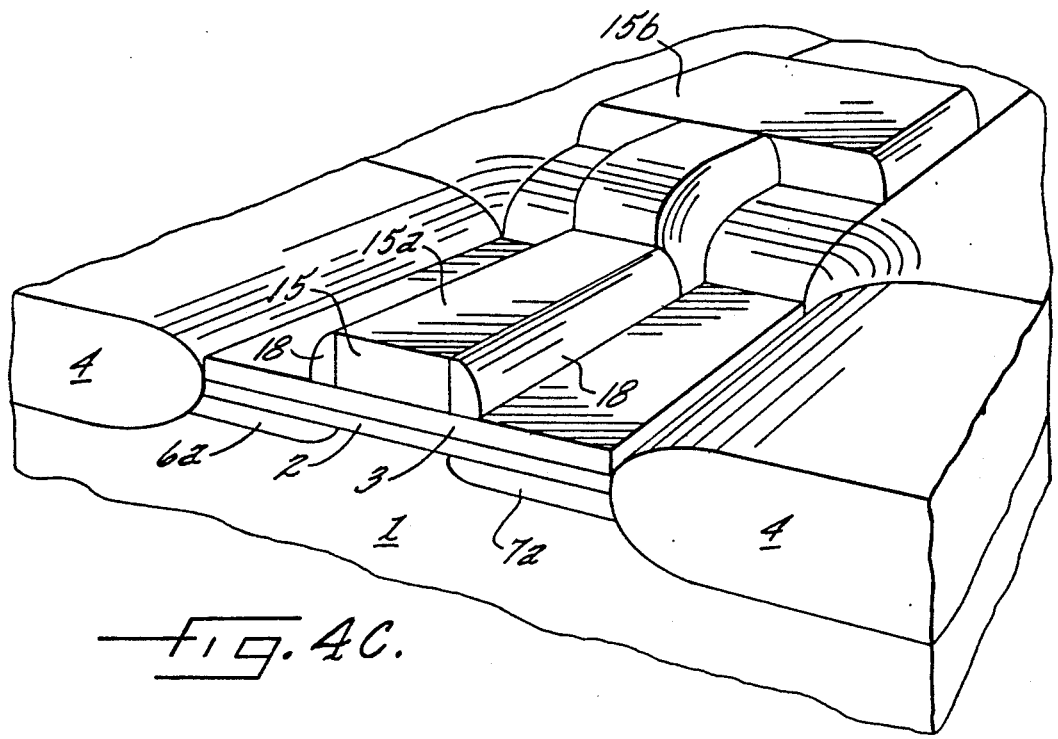
FIG. 4C illustrates the substrate of FIG. 4C after spacer formation.
Figure 4D:
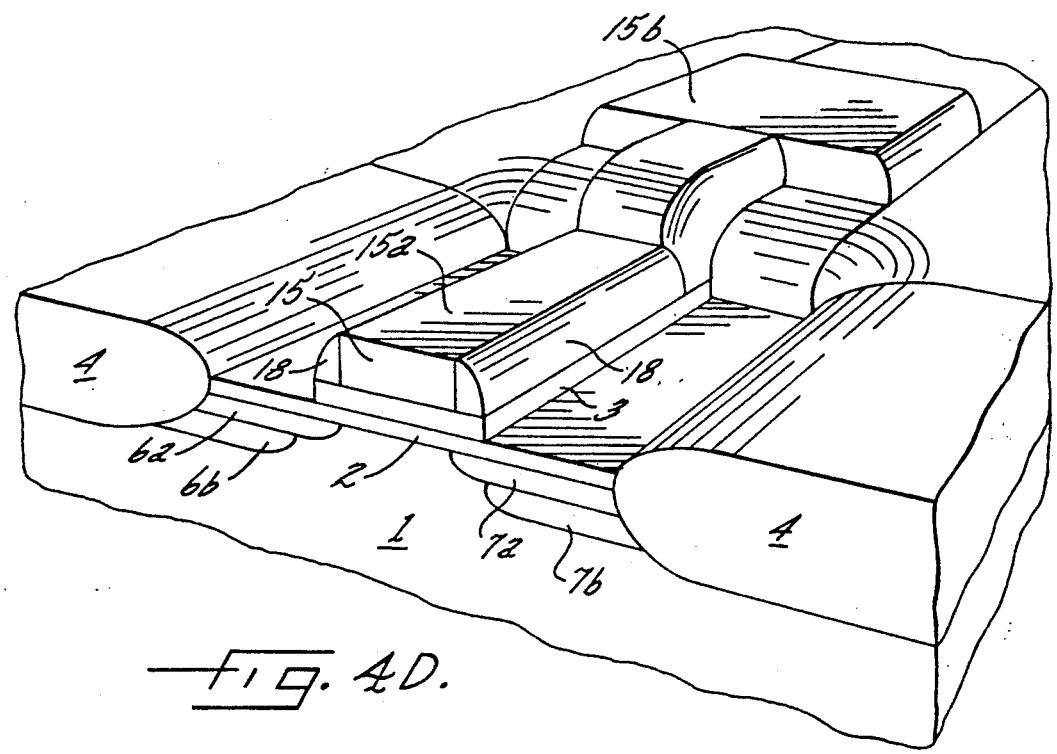
FIG. 4D illustrates the substrate of FIG. 4C after patterning the polycrystalline silicon-containing layer, according to the present invention.

Referring to FIG. 4C, an oxide spacer 18 is then formed on the second poly layer 15. Oxide spacer 18 may be formed using a conformal oxide deposition followed by an anisotropic etch, using techniques well known to those having skill in the art. Finally, referring to FIG. 4D, the spacer 18 is used as a mask to etch first poly layer 3 down to the gate oxide layer 2. A high doping concentration process is then performed to form source 6b and drain 7b, and the entire structure is then annealed. Accordingly, a "double poly" process has been used to form the gate contact for the field effect transistor, with the first poly layer being used as the field oxide mask according to the present invention.

It will be understood by those having skill in the art that the embodiments of FIGS. 2A-2C, 3A-3C and 4A-4D are provided to illustrate how the MADROX process may be integrated into many FET transistor fabrication processes, such as metal contact, double poly contact and spacer processes to form a MADFET. Many other fabrication structures and processes well known to those having skill in the art may also be integrated into the MADROX process.

Referring now to FIG. 5, a microphotograph of a cross section of the substrate of FIG. 1D formed according to the present invention will now be shown. The microphotograph illustrates a substrate 1, having gate oxide regions 2 thereon. Patterned poly layer 3, about 3000Å thick, is shown on oxide 2. Also shown are bird's beak-free recess oxide isolation regions 4, about 2000Å thick. As dramatically illustrated in this microphotograph, the recessed oxide isolation regions 4 do not extend under the active device region. The width of the surface of the semiconductor substrate 5 in which active devices are formed is 1 μm or less.

As described above, the MADROX process of the present invention may be used to form recessed oxide isolation regions at low temperature with minimal encroachment into the active device area using well known materials and well characterized process steps. Maximal areal density transistors and other devices are thereby produced.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A process for forming maximum areal density recessed oxide (MADROX) isolation regions in a monocrystalline silicon substrate, comprising the steps of:
    forming an insulating layer on said monocrystalline silicon substrate; and then
    fabricating a patterned polycrystalline silicon-containing layer on said insulating layer, said patterned polycrystalline silicon-containing layer defining predetermined regions of said monocrystalline silicon substrate; and then
    performing plasma assisted oxidation on said monocrystalline silicon substrate having the insulating layer and the patterned polycrystalline silicon-containing layer thereon, to thereby form recessed oxide isolation regions in the predetermined regions of said monocrystalline silicon substrate, with minimal encroachment under the patterned polycrystalline silicon-containing layer and with oxidizing the polycrystalline silicon-containing layer on said monocrystalline silicon substrate during the plasma assisted oxidation step.

2. The process of claim 1 wherein said insulating layer comprises silicon dioxide.

3. The process of claim 1 wherein said insulating layer is void free.

4. The process of claim 2 wherein said silicon dioxide layer is at least 7 nm thick.

5. The process of claim 1 wherein said polycrystalline silicon-containing layer is selected from the group consisting of undoped polycrystalline silicon, doped polycrystalline silicon and polycide.

6. The process of claim 1 wherein said plasma assisted oxidation is performed at temperatures between 300° C. and 700° C.

7. The process of claim 1 wherein said plasma assisted oxidation is performed at a temperature of about 500° C.

8. The process of claim 1 wherein said plasma assisted oxidation comprises radio frequency generated plasma assisted oxidation.

9. The process of claim 1 wherein said fabricating step is followed by the step of fabricating spacers on the sidewall of said patterned polycrystalline silicon-containing layer.

10. A process for forming maximum areal density semiconductor devices in a monocrystalline silicon substrate, comprising the steps of:
    forming an insulating layer on said monocrystalline silicon substrate; and then
    fabricating a patterned polycrystalline silicon-containing layer on said insulating layer, said patterned polycrystalline silicon-containing layer defining predetermined regions of said monocrystalline silicon substrate; and then
    performing plasma assisted oxidation on said monocrystalline silicon substrate having the insulating layer and the patterned polycrystalline silicon-containing layer thereon, to thereby form recessed oxide isolation regions in the predetermined regions of said monocrystalline silicon substrate, with minimal encroachment under the patterned polycrystalline silicon-containing layer and without oxidizing the polycrystalline silicon-containing layer on said monocrystalline silicon substrate during said plasma assisted oxidation step;

removing said patterned polycrystalline silicon-containing layer; and forming said semiconductor devices in the monocrystalline silicon substrate, between the recessed oxide isolation regions.

11. The process of claim 10 wherein said insulating layer comprises silicon dioxide.

12. The process of claim 10 wherein said insulating layer is void free.

13. The process of claim 11 wherein said silicon dioxide layer is at least 7 nm thick.

14. The process of claim 10 wherein said polycrystalline silicon-containing layer is selected from the group consisting of undoped polycrystalline silicon, doped polycrystalline silicon and polycide.

15. The process of claim 10 wherein said plasma assisted oxidation is performed at temperatures between 300° C. and 700° C.

16. The process of claim 10 wherein said plasma assisted oxidation is performed at a temperature of about 500° C..

17. The process of claim 10 wherein said plasma assisted oxidation comprises radio frequency generated plasma assisted oxidation.

18. The process of claim 10 wherein said fabricating step is followed by the step of fabricating spacers on the sidewall of said patterned polycrystalline silicon-containing layer.

19. The process of claim 10 wherein said semiconductor device forming step comprises the step of forming bipolar transistors in the monocrystalline silicon substrate, between the recessed oxide isolation regions.

20. A process for forming Maximum Areal Density Field Effect Transistor (MADFET) devices in a monocrystalline silicon substrate, comprising the steps of:

forming an insulating layer on said monocrystalline silicon substrate; and then fabricating a patterned polycrystalline silicon-containing layer on said insulating layer, said patterned polycrystalline silicon-containing layer defining first predetermined regions of said monocrystalline silicon substrate; and then performing plasma assisted oxidation on said monocrystalline silicon substrate having the insulating layer and the patterned polycrystalline silicon-containing layer thereon, to thereby form recessed oxide isolation regions in the first predetermined regions of said monocrystalline silicon substrate, with minimal encroachment under the patterned polycrystalline silicon-containing layer and without oxidizing the polycrystalline silicon-containing layer on said monocrystalline silicon substrate during said plasma assisted oxidation step; and further patterning said polycrystalline silicon-containing layer to define second predetermined regions of said monocrystalline silicon substrate between said recessed oxide isolation regions and the polycrystalline silicon-containing layer.

21. The process of claim 20 further comprising the step of:

forming source and drain regions in the second predetermined regions of the monocrystalline silicon substrate between the recessed oxide isolation regions and the polycrystalline silicon-containing layer.

22. The process of claim 20 wherein said insulating layer comprises silicon dioxide.

23. The process of claim 20 wherein said insulating layer is void free.

24. The process of claim 21 wherein said silicon dioxide layer is at least 7 nm thick.

25. The process of claim 20 wherein said polycrystalline silicon-containing layer is selected from the group consisting of undoped polycrystalline silicon, doped polycrystalline silicon and polycide.

26. The process of claim 20 wherein said plasma assisted oxidation is performed at temperatures between 300° C. and 700° C.

27. The process of claim 20 wherein said plasma assisted oxidation is performed at a temperature of about 500° C.

28. The process of claim 20 wherein said plasma assisted oxidation comprises radio frequency generated plasma assisted oxidation.

29. The process of claim 20 wherein said fabricating step is followed by the step of fabricating spacers on the sidewall of said patterned polycrystalline silicon-containing layer.

30. The process of claim 20 further comprising the step of forming source and drain contacts for said source and drain regions, respectively.

31. The process of claim 20 further comprising the step of forming a gate contact, electrically connected to said polycrystalline silicon-containing layer.

32. The process of claim 20 wherein said further patterning step comprises the steps of:

forming a patterned second polycrystalline silicon-containing layer on said polycrystalline silicon-containing layer; and patterning said polycrystalline silicon-containing layer using said second patterned polycrystalline silicon-containing layer.

33. The process of claim 32 wherein said forming a patterned second polycrystalline silicon-containing layer step is followed by the step of forming a spacer on the sidewall of said patterned second polycrystalline silicon-containing layer.

* * * * *

UNITED STATES PATENT AND TRADEMARK OFFICE
CERTIFICATE OF CORRECTION

PATENT NO. : 5,039,625

DATED : August 13, 1991

INVENTOR(S) : Reisman et al.

It is certified that error appears in the above-identified patent and that said Letters Patent is hereby corrected as shown below:

Column 1, line 47, "2 82 m," should be --2μm,--

Column 6, line 61, "1/2"" should be --1/4"--

Column 7, line 14, "$" should be --5--

Column 8, line 7, "z" should be --2--

Signed and Sealed this

Second Day of March, 1993

Attest:

STEPHEN G. KUNIN

Attesting Officer

Acting Commissioner of Patents and Trademarks